United States Patent
Kido et al.

(10) Patent No.: US 11,781,244 B2
(45) Date of Patent: Oct. 10, 2023

(54) SEED CRYSTAL FOR SINGLE CRYSTAL 4H—SiC GROWTH AND METHOD FOR PROCESSING THE SAME

(71) Applicants: SHOWA DENKO K.K., Tokyo (JP); DENSO CORPORATION, Kariya (JP)

(72) Inventors: Takanori Kido, Tsukuba (JP); Masatake Nagaya, Seto (JP); Hidetaka Takaba, Obu (JP)

(73) Assignees: RESONAC CORPORATION, Tokyo (JP); DENSO CORPORATION, Kariya (JP)

( * ) Notice: Subject to any disclaimer, the term of this patent is extended or adjusted under 35 U.S.C. 154(b) by 710 days.

(21) Appl. No.: 16/963,521

(22) PCT Filed: Dec. 21, 2018

(86) PCT No.: PCT/JP2018/047225
§ 371 (c)(1),
(2) Date: Jul. 21, 2020

(87) PCT Pub. No.: WO2019/146336
PCT Pub. Date: Aug. 1, 2019

(65) Prior Publication Data
US 2021/0047750 A1    Feb. 18, 2021

(30) Foreign Application Priority Data
Jan. 24, 2018  (JP) .................................. 2018-009989

(51) Int. Cl.
C30B 29/36 (2006.01)
B24B 7/22 (2006.01)
(Continued)

(52) U.S. Cl.
CPC .............. *C30B 29/36* (2013.01); *B24B 7/228* (2013.01); *C30B 33/00* (2013.01); *H01L 21/02013* (2013.01)

(58) Field of Classification Search
CPC .......... C30B 29/36; C30B 33/00; C30B 25/02
See application file for complete search history.

(56) References Cited

U.S. PATENT DOCUMENTS

2004/0134418 A1   7/2004  Hirooka
2010/0300423 A1  12/2010  Oshima
(Continued)

FOREIGN PATENT DOCUMENTS

CN    104813439 A   7/2015
CN    107002281 A   8/2017
(Continued)

OTHER PUBLICATIONS

Office Action dated May 31, 2021 issued by the Chinese Patent Office in Chinese Application No. 201880087282.X.
(Continued)

*Primary Examiner* — Elizabeth E Mulvaney
(74) *Attorney, Agent, or Firm* — Sughrue Mion, PLLC

(57) ABSTRACT

A seed crystal for single crystal 4H-SiC growth of the present invention is a disk-shaped seed crystal for single crystal 4H-SiC growth having a diameter of more than 150 mm and having a thickness within a range of more than or equal to 1 mm and less than or equal to 0.03 times of the diameter, in which one surface on which the single crystal 4H-SiC is grown is a mirror surface and an Ra of the other surface is more than 10 nm, and an absolute value of magnitude of waviness in a state where the seed crystal is freely deformed so that an internal stress distribution is reduced is less than or equal to 12 μm.

7 Claims, 2 Drawing Sheets

(51) Int. Cl.
*C30B 33/00* (2006.01)
*H01L 21/02* (2006.01)

(56) References Cited

U.S. PATENT DOCUMENTS

| | | | | |
|---|---|---|---|---|
| 2013/0284160 | A1* | 10/2013 | Uchida | B28D 5/045 |
| | | | | 125/21 |
| 2015/0303050 | A1* | 10/2015 | Sasaki | H01L 21/02019 |
| | | | | 438/692 |

FOREIGN PATENT DOCUMENTS

| | | |
|---|---|---|
| JP | 08-066850 A | 3/1996 |
| JP | 2002-308697 A | 10/2002 |
| JP | 2004-168649 A | 6/2004 |
| JP | 2006-261527 A | 9/2006 |
| JP | 2007-284283 A | 11/2007 |
| JP | 2008-227534 A | 9/2008 |
| JP | 4224755 B2 | 2/2009 |
| JP | 4494856 B2 | 6/2010 |
| JP | 4499698 B2 | 7/2010 |
| JP | 2011-009700 A | 1/2011 |
| JP | 2011-222750 A | 11/2011 |
| JP | 2014-210687 A | 11/2014 |
| JP | 2016-501809 A | 1/2016 |
| JP | 2017-065954 A | 4/2017 |
| WO | 2014/065949 A1 | 5/2014 |

OTHER PUBLICATIONS

Masatake Nagaya, et al., "The Twyman effect in a SiC wafer processing process", Proceedings of the 1st Meeting on Advanced Power Semiconductors, pp. 86-87.
International Search Report for PCT/JP2018/047225 dated Mar. 26, 2019 (PCT/ISA/210).
Notice of Allowance dated Sep. 14, 2021 from the Japanese Patent Office in JP Application No. 2018-009989.

* cited by examiner

SEED CRYSTAL FOR SINGLE CRYSTAL 4H—SIC GROWTH AND METHOD FOR PROCESSING THE SAME

TECHNICAL FIELD

The present invention relates to a seed crystal for single crystal 4H-SiC growth and a method for processing the same.

This application is a National Stage of International Application No. PCT/JP2018/047225 filed Dec. 21, 2018, claiming priority based on Japanese Patent Application No. 2018-009989, filed Jan. 24, 2018, the content of which is incorporated herein by reference.

BACKGROUND ART

Since silicon carbide (SiC) which is a semiconductor material has a wider band gap than that of silicon (Si) which is currently widely used for substrates for devices, research has been performed on manufacturing of power devices, high frequency devices, high temperature operation devices, and the like using single crystal SiC substrates.

A single crystal SiC substrate is formed (for example, refer to Patent Document 1), for example, by cutting out a substrate (a part to be a substrate) from a single crystal SiC ingot manufactured through a sublimation method and mirror-finishing the surface of the cut substrate.

According to the description of Patent Document 2, the sublimation method has a problem of macro-defects during crystal growth which is caused by adhesion failure between a seed crystal and a seed crystal support portion of a crucible for single crystal growth. However, it is disclosed that, in a case where the seed crystal and the seed crystal support portion are fixed to each other through a carbon adhesive to allow 4H-SiC growth, mechanical polishing of the silicon surface which is an adhesive surface of the seed crystal with, for example, 9 μm diamond abrasive grains to roughen the adhesion surface and increase the contact area (exposed area), and adding a surface other than a (0001) silicon surface to a surface orientation of the contact surface are effective in improving adhesiveness, and it is further disclosed that, in a case where a processing-affected layer remains on a growth surface on which single crystal growth is carried out, growing is generally carried out after removing the processing-affected layer since the processing-affected layer degrades the quality of grown crystals.

According to the description of Patent Document 3, it is disclosed that also in the sublimation method, in a case where growing is carried out in a configuration of mounting a seed crystal of a hexagonal single crystal SiC on a rear surface of a crucible lid so that one surface of the seed crystal comes into contact with the crucible lid, poor flatness of the seed crystal surface on the crucible lid greatly degrades the quality of an ingot of which is grown on the seed crystal and that, as means for solving the problem, the flatness of the surface on the crucible lid is improved by assiduously performing observation and analysis of combinations of unlimited polishing conditions and selecting conditions under which the surface to be polished first becomes flat when performing mechanical polishing with diamond abrasive grains.

CITATION LIST

Patent Literature

[Patent Document 1]
Japanese Patent No. 4499698

[Patent Document 2]
Japanese Patent No. 4224755
[Patent Document 3]
Japanese Patent No. 4494856

Non Patent Literature

[Non-Patent Document 1]
Masatake Nagaya, Takanori Kido, Tomohiro Nakayama, Kenji Kawata, Tomohisa Kato: Proceedings of the 1st Meeting on Advanced Power Semiconductors, pp. 86-87

SUMMARY OF THE INVENTION

Technical Problem

The method for fixing a seed crystal disclosed in the above-described Patent Document 2 has no problems in a case where the size of seed crystal is small. However, it has become clear that, when the method is applied to a large-diameter seed crystal in order to have a large-diameter single crystal SiC substrate, problems of undulation waviness may arise due to the Twyman effect (for example, refer to Non-Patent Document 1) in which stress balance occurs between front and rear surfaces and the seed crystal is warped. In this technique, there is no processing-affected layer on one surface of a silicon carbide single crystal on which the silicon carbide single crystal is grown, and there is a processing-affected layer on the other surface of the silicon carbide single crystal that adheres to the seed crystal support portion. Therefore, in terms of stress balance, the seed crystal has a property of warping so that the other surface side of the silicon carbide single crystal becomes convex. When the size of seed crystal is small, the ratio (aspect ratio) of a thickness to a diameter is sufficiently large, and therefore, the shape of the seed crystal does not change. However, since the aspect ratio becomes smaller due to a large-diameter seed crystal, it can be estimated that the change in shape such as a convex warp on the other surface side due to the Twyman effect will become apparent. Furthermore, it has become clear that, in the case where the seed crystal and the seed crystal support portion are fixed to each other through a carbon adhesive to allow 4H-SiC growth, a large waviness due to this Twyman effect easily causes adhesion failure.

The technique disclosed in Patent Document 3 is for solving problems in the case where growing is carried out in a configuration of mounting a seed crystal of a single crystal SiC on a rear surface of a crucible lid so that one surface of the seed crystal comes into contact with the crucible lid. However, the technique cannot solve problems caused by an increased diameter in the above-described case where 4H-SiC growth is carried out in a configuration in which a seed crystal and a seed crystal support portion are fixed to each other through a carbon adhesive. Furthermore, it is necessary to have an abstract procedure which is to assiduously perform observation and analysis of combinations of unlimited polishing conditions and select conditions under which the surface to be polished first becomes flat. Moreover, even in the case where growing is carried out in a configuration of mounting a seed crystal of a single crystal SiC on a rear surface of a crucible lid so that one surface of the seed crystal comes into contact with the crucible lid, it is difficult to say that a universal specific method for solving the problems and sufficient information allowing realization by those skilled in the art are disclosed therein.

In this manner, in the related art, in the case where a large-diameter seed crystal and a seed crystal support portion are fixed to each other through a carbon adhesive to allow 4H-SiC growth, it is impossible to solve a problem of macro-defects during crystal growth which is caused by adhesion failure between the seed crystal and the seed crystal support portion of a crucible for single crystal growth, which has become a major obstacle to devices in which a single crystal SiC substrate is used becoming widespread.

The present invention has been made in consideration of the above-described circumstances, and an object of the present invention is to provide a seed crystal for single crystal 4H-SiC growth in which the size of waviness generated by the Twyman effect is minimized, and a method for processing the same.

Solution to Problem

The present inventors have conducted extensive studies in order to solve the above-described problems, and as a result, they have found a technique in which a large-diameter seed crystal is fixed in a state of being convexly warped on the other surface side due to the Twyman effect, the other surface which is an adhesion surface with a seed crystal support portion is roughened and flattened, the flattened other surface is then vacuum-adsorbed onto a flat table equipped with a vacuum adsorption mechanism to hold the seed crystal so that the flattened other surface becomes a reference surface, and one surface on which single crystal 4H-SiC growth is carried out is flattened and formed to a mirror surface to minimize convex warping on the other surface side due to the Twyman effect of the large-diameter seed crystal, and completed the present invention.

The present invention provides the following means.

[1] A disk-shaped seed crystal for single crystal 4H-SiC growth having a diameter of more than 150 mm and having a thickness within a range of more than or equal to 1 mm and less than or equal to 0.03 times of the diameter, in which one surface on which the single crystal 4H-SiC growth is carried out is a mirror surface and an Ra of the other surface is more than 10 nm, and an absolute value of magnitude of waviness in a state where the seed crystal is freely deformed so that an internal stress distribution is reduced is less than or equal to 12 μm.

[2] The seed crystal for single crystal 4H-SiC growth according to [1], in which the absolute value of the magnitude of the waviness is less than or equal to 8 μm.

[3] The seed crystal for single crystal 4H-SiC growth according to [1] or [2], in which the one surface on which the single crystal 4H-SiC growth is carried out is a carbon surface.

[4] A method for processing a disk-shaped seed crystal for single crystal 4H-SiC growth having a diameter of more than 150 mm and having a thickness within a range of more than or equal to 1 mm and less than or equal to 0.03 times of the diameter, the method including: a first step of cutting out a disk-shaped crystal from a columnar single crystal 4H-SiC ingot having a diameter of more than 150 mm; a second step of fixing the cut-out crystal to a base material to grind one surface on which the single crystal 4H-SiC growth is carried out so as to have a flat mirror surface; a third step of releasing the fixation of the crystal to the base material so that the one surface and the other surface of the crystal respectively become a concave surface and a convex surface due to the Twyman effect; a fourth step of fixing the one surface side of the crystal to a plate so that the concave state of the one surface is maintained; a fifth step of grinding the other surface which has become convex so as to have a flat surface having an Ra of more than 10 nm; a sixth step of releasing the fixation of the crystal to the plate; a seventh step of vacuum-adsorbing the other surface side of the crystal onto a flat grinding table equipped with a vacuum adsorption mechanism; and an eighth step of grinding the one surface which has become concave so as to have a flat mirror surface, in which grinding amounts in the first step, the fifth step, and the eighth step are adjusted so that an absolute value of magnitude of waviness of the crystal in a state where the seed crystal is freely deformed so that an internal stress distribution is reduced becomes less than or equal to 12 μm.

[5] The method for processing a seed crystal for single crystal 4H-SiC growth according to [4], in which the grinding amounts in the first step, the fifth step, and the eighth step are adjusted so that an absolute value of magnitude of waviness of the crystal becomes less than or equal to 8 μm.

[6] The method for processing a seed crystal for single crystal 4H-SiC growth according to [4] or [5], further including: subsequently polishing and finishing the one surface after the eighth step.

[7] The method for processing a seed crystal for single crystal 4H-SiC growth according to any one of [4] to [6], in which the one surface on which the single crystal 4H-SiC growth is carried out is a carbon surface.

Advantageous Effects of Invention

In the seed crystal for single crystal 4H-SiC growth of the present invention, an absolute value of magnitude of waviness in a state where an internal stress distribution is reduced is less than 12 μm. For this reason, it is possible to solve a problem of a macro-defect during crystal growth caused by adhesion failure between a seed crystal and a seed crystal support portion of a crucible for single crystal growth.

According to the method for processing a seed crystal for single crystal 4H-SiC growth of the present invention, in a case where a seed crystal and a seed crystal support portion are fixed to each other through a carbon adhesive to allow 4H-SiC growth, it is possible to obtain the above-described seed crystal for single crystal 4H-SiC growth in which waviness due to the Twyman effect occurring in a large-diameter seed crystal is minimized by roughening the adhesion surface of the seed crystal for improving adhesiveness with the seed crystal support portion and by removing a processing-affected layer, which degrades the quality of grown crystals, on one surface on which the single crystal 4H-SiC growth is carried out.

DESCRIPTION OF EMBODIMENT

Figure 1:
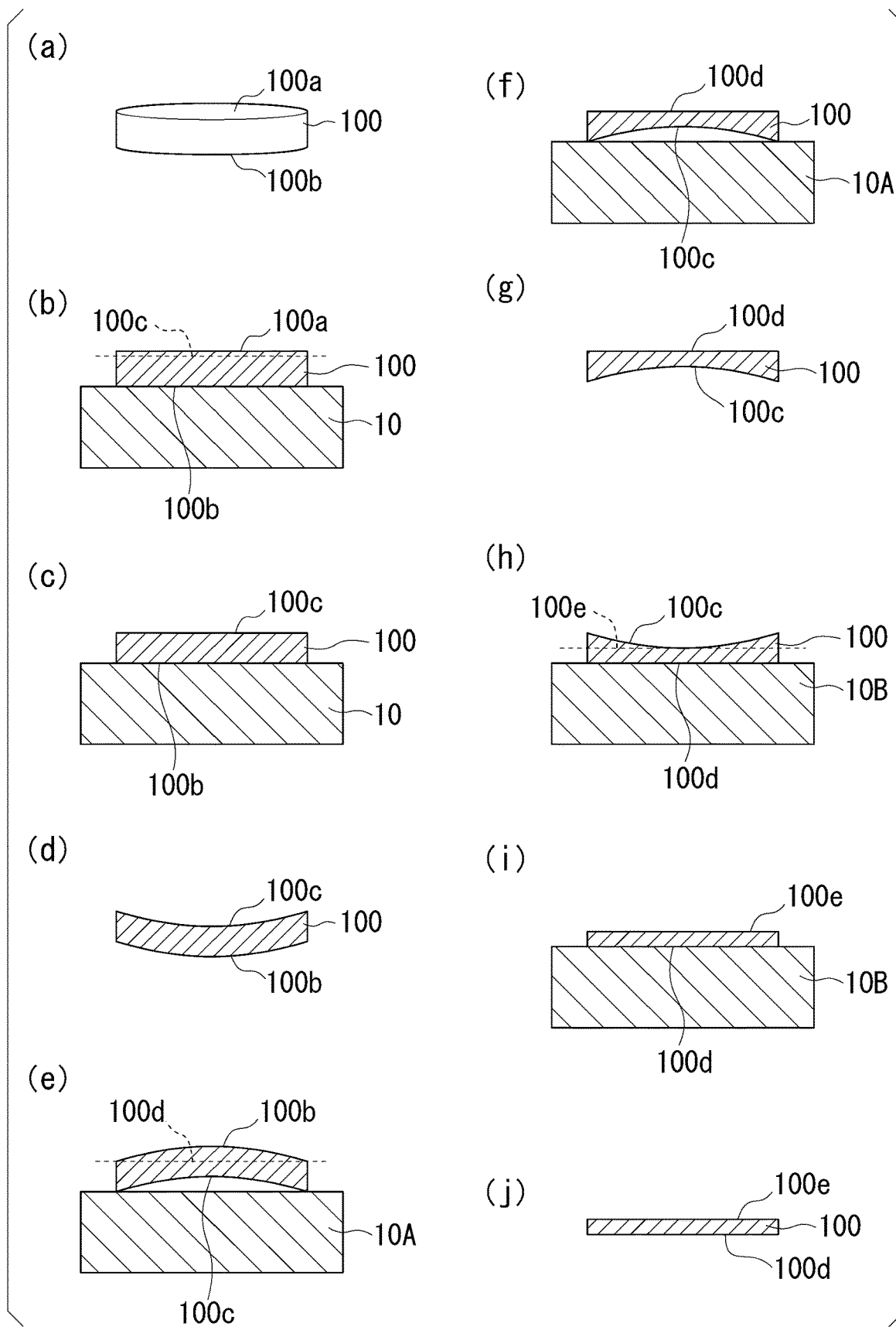
FIG. 1 is a cross-sectional view of an object to be treated in each step included in a method for processing a seed crystal for single crystal 4H-SiC growth of the present invention.

Hereinafter, the present invention will be described in detail with appropriate reference to the drawings. In the drawings used in the following description, a part that becomes a feature of the present invention is sometimes enlarged for convenience in order to allow the feature to be easily understood, and the dimensional ratios of each constituent element and the like are sometimes different from the actual ones. In addition, the materials, dimensions, and the like exemplified in the following description are merely examples, and the present invention is not limited thereto and can be implemented by being appropriately modified within the range in which the effect of the present invention is exhibited.

A seed crystal for single crystal 4H-SiC growth according to an embodiment of the present invention is a substantially disk-shaped seed crystal for single crystal 4H-SiC growth (hereinafter, sometimes simply referred to as a crystal) which has a diameter of more than 150 mm and a thickness within a range of more than or equal to 1 mm and less than or equal to 0.03 times of the diameter.

In the seed crystal for single crystal 4H-SiC growth according to the present embodiment, one surface (main surface) on which single crystal 4H-SiC growth is carried out is a mirror surface and an Ra of the other surface (main surface) is more than 10 nm (the "mirror surface" which will be described below in the present specification is a surface of which an Ra obtained through AFM measurement is less than or equal to 2 nm). Usually, the one surface on which single crystal 4H-SiC growth is carried out is regarded as a carbon surface (C surface) and the other surface is regarded as a silicon surface (Si surface). However, it is unnecessary to limit the present invention to this combination in the present embodiment.

An absolute value of magnitude of waviness of the crystal may be less than or equal to 12 µm and is preferably less than or equal to 8 µm in a state in which a distribution of internal stress caused by a difference in volume between processing-affected layers on one surface and the other surface is reduced, more specifically, in a state in which the crystal is naturally deformed (without application of external forces) so that the internal stress distribution is reduced, that is, in a state in which the crystal is freely deformed so as to minimize internal stress. The waviness here is measured using a stylus-type displacement meter at an evaluation length obtained by subtracting 10 mm from the diameter of the other surface.

In the seed crystal for single crystal 4H-SiC growth according to the present embodiment, an absolute value of magnitude of waviness in a state where the seed crystal is freely deformed so that an internal stress distribution is reduced is less than 12 µm. For this reason, it is possible to solve a problem of a macro-defect during crystal growth caused by adhesion failure between a seed crystal and a seed crystal support portion of a crucible for single crystal growth.

In addition, a method for processing a seed crystal for single crystal 4H-SiC growth of the present invention is a method for processing a substantially disk-shaped seed crystal for single crystal 4H-SiC growth, which has a diameter of more than 150 mm and a thickness within a range of more than or equal to 1 mm and less than or equal to 0.03 times of the diameter, and mainly includes the following 8 steps.

(First Step)

A columnar single crystal 4H-SiC ingot having a diameter of more than 150 mm is prepared, and a substantially disk-shaped crystal 100 shown in (a) of FIG. 1 is cut out therefrom. The surface of the crystal 100 is drawn as a flat surface in (a) of FIG. 1, but in reality, is not a completely flat surface as wavinesses are formed along with the cutting out thereof.

The ingot can be cut with a wire saw in which diamond abrasive grains are used. In addition, the ingot may be cut with an electric discharge machining device. Usually, the seed crystal for single crystal 4H-SiC growth at a stage of being cut from the ingot is not flat since it has an uneven surface, and has processing-affected layers formed due to the cutting. Here, aside of one surface 100*a* of the cut-out crystal is regarded as a surface on which single crystal 4H-SiC growth is carried out.

(Second Step)

As shown in (b) of FIG. 1, a side of the other surface 100*b* of the cut-out crystal 100 is fixed to a base material 10 such as a plate or a grinding table, and the one surface 100*a* on the opposite side is ground so as to become a flat mirror surface 100*c*. The fixation of the crystal to the base material 10 may be performed through either a method for fixing a crystal to a plate using wax or a method for fixing a crystal to a grinding table using a vacuum chuck.

Then, the one surface 100*a* of the cut-out crystal 100 is ground so as to become the flat mirror surface 100*c* as shown in (c) of FIG. 1. More specifically, grinding processing is performed with a low grit number diamond wheel (with coarse abrasive grains) and subsequently with a high grit number diamond wheel (with fine abrasive grains) so that the one surface on which single crystal 4H-SiC growth is carried out becomes flat thereby finishing the one surface 100*a* side into a mirror surface 100*c* (with a small surface roughness).

(Third Step)

As shown in (d) of FIG. 1, the fixation of the crystal 100 to the base material is released so that the one surface 100*c* and the other surface 100*b* of the crystal respectively become a concave surface and a convex surface due to the Twyman effect.

(Fourth Step)

As shown in (e) of FIG. 1, the one surface 100*c* side, that is, the one surface 100*c* is fixed to a plate 10A using wax so that the concave state of the one surface 100*c* is maintained.

(Fifth Step)

As shown in (f) of FIG. 1, the other surface 100*b* which has become convex is ground so as to become a flat surface 100*d* having an Ra of more than 10 nm. More specifically, grinding processing is performed on the other surface 100*b* using a low grit number diamond wheel (with coarse abrasive grains) so that the other surface 100*b* becomes flat, to increase the surface roughness of the other surface 100*b*.

(Sixth Step)

As shown in (g) of FIG. 1, the fixation of the crystal 100 to the plate 10A is released.

(Seventh Step)

As shown in (h) of FIG. 1, the other surface 100*d* which has become flat through the grinding processing is vacuum-adsorbed onto a flat grinding table 10B equipped with a vacuum adsorption mechanism.

(Eighth Step)

As shown in (i) of FIG. 1, the one surface 100*c* which has become concave is ground so as to become a flat mirror surface 100*e* (with a small surface roughness) which has a small processing-affected layer. More specifically, the one surface 100*c* is ground first with a low grit number diamond wheel (with coarse abrasive grains) and subsequently with a high grit number diamond wheel (with fine abrasive grains) so as to become flat to finish the one surface 100*c* side into a mirror surface 100*e* (with a small surface roughness). Finally, a seed crystal for single crystal 4H-SiC growth of the present invention can be obtained by releasing the fixation of the crystal 100 to the grinding table B.

After the eighth step, a finishing process may be subsequently performed by polishing the one surface 100e.

According to the method for processing a seed crystal for single crystal 4H-SiC growth according to the present embodiment, in a case where a seed crystal and a seed crystal support portion are fixed to each other through a carbon adhesive to allow 4H-SiC growth, it is possible to obtain the above-described seed crystal for single crystal 4H-SiC growth in which waviness due to the Twyman effect occurring in a large-diameter seed crystal is minimized by roughening the adhesion surface of the seed crystal for improving adhesiveness with the seed crystal support portion and by removing a processing-affected layer, which degrades the quality of grown crystals, on one surface on which the single crystal 4H-SiC growth is carried out.

In the first step, the fifth step, and the eighth step, the grinding amount is adjusted so that an absolute value of magnitude of waviness in a state where the seed crystal is naturally deformed so that the internal stress distribution caused by the difference in volume between processing-affected layers on one surface and the other surface is reduced becomes less than or equal to 12 µm and preferably less than or equal to 8 µm. The absolute value of magnitude of waviness here is measured using a stylus-type displacement meter at a length obtained by subtracting 10 mm from the diameter of the other surface.

Usually, the seed crystal for single crystal 4H-SiC growth is not flat since it has an uneven surface at a stage of being cut from an ingot, and has processing-affected layers formed due to cutting.

In the present invention, the seed crystal processed to be flat means a seed crystal of which the variation in height of the processed surface excluding a region of 2 mm from an end of the seed crystal or the variation in thickness of the seed crystal is less than or equal to 10 µm. Ina case where the seed crystal is fixed with wax or the like and is processed to flatten only a single surface through single-side lapping or grinding, it is inappropriate to define the seed crystal processed to be flat by the variation in thickness. Therefore, the seed crystal is defined by the variation in height of the processed surface in the processed state. In a case where the seed crystal is processed to flatten both surfaces, the seed crystal is defined by the variation in thickness of the substrate.

In the processing of the single crystal SiC substrate, steps before proceeding to a CMP step are examined according to combinations of various processing processes as disclosed, for example, in Non-Patent Document 1 while aiming at high efficiency, high quality, and low cost. In Non-Patent Document 1, double-side lapping in which B4C abrasive grains are used is performed. However, this is merely intermediate processing, and it is necessary to perform processing using finer diamond abrasive grains in order to make the substrate have processing-affected layers controlled to a degree such that the single crystal SiC substrate is mechanically processed for proceeding to a CMP step. There are options such as lapping, polishing, and grinding as the processing using fine diamond abrasive grains, and an optimum combination of processes is selected and performed.

Also in the processing of the seed crystal for single crystal 4H-SiC growth, the above-described processing techniques for processing a substrate can approximately be used as they are.

Lapping, polishing, and grinding are names of widely used methods for mechanically processing workpieces, but the definition thereof is not universal. For example, polishing in the present invention may be sometimes called soft lapping, rubbing, or soft polishing. Therefore, the terms lapping, polishing, and grinding used in the present invention are defined as follows.

Lapping is a method for mechanically processing a workpiece which is also called lapping, and is roughly classified into single-side lapping and double-side lapping. Single-side lapping is a processing method which is performed such that a workpiece is disposed on a metal table called a lapping plate, abrasive grains are interposed between the lapping plate and the lower surface of the workpiece, and the workpiece is slid while applying pressure on the workpiece from above. Double-side lapping is a processing method which is performed such that a thin substrate-shaped workpiece is mainly used as an object to be processed, placed in a hole provided in a workpiece-holding jig called a carrier thinner than the workpiece, and disposed so as to be interposed between two plate-shaped metal tables called lapping plates as well, abrasive grains are further interposed between both surfaces of the workpiece and the two lapping plates, and the workpiece is slid while applying pressure on the workpiece held by the carrier and providing a revolution motion and an autorotation motion using a gear mechanism.

In both cases of single-side lapping and double-side lapping, there is wet lapping in which processing is performed by adding a processing liquid to abrasive grains and dry lapping in which processing is performed by burying abrasive grains in a lapping plate without adding a processing liquid. There are oil-based and water-based processing liquids for wet lapping. In a case of processing a single crystal SiC substrate, wet lapping in which hard abrasive grains such as diamond and a water-based or oil-based processing liquid are used is generally employed, and both single-side lapping and double-side lapping are examined for wet lapping.

Polishing is a processing method in which processing is performed in the same manner as in the above-described wet lapping by attaching a polishing cloth, a polisher, or a soft sheet-shaped tool called pad to the above-described lapping plate. In a case of processing a single crystal SiC substrate, polishing is a processing method which is employed as finishing processing in mechanical processing mainly using a water-based processing liquid in which fine diamond abrasive grains are dispersed. Single-side polishing and double-side polishing are examined for polishing as well. Among polishing methods, there is also chemical mechanical polishing called CMP as an abbreviation in a processing method in which processing is promoted using an additive, such as acid or an oxidizer, which causes a chemical reaction with a workpiece.

Grinding is a mechanical processing method for removing the surface of a workpiece by bringing a grindstone rotating at high speed into contact with the workpiece fixed to a table called a stage or a table. In a case where a method for fixing a workpiece is vacuum-adsorbing using a vacuum chuck, a table to which the workpiece is to be fixed is sometimes simply called a vacuum chuck or a chuck. Usually, a rotational motion or a reciprocating motion is provided for a workpiece fixed to a table depending on the shape of the workpiece so that the processing surface is flattened uniformly. Since abrasive grains are fixed to a grindstone and generate a large amount of heat at a processing point, processing is usually performed while supplying an aqueous cooling liquid called a coolant for cooling. In a case of processing a single crystal SiC substrate, a grindstone formed by binding and fixing diamond abrasive grains to the grindstone using resin, metal, or a glassy material called a binding material or a bonding material is used.

A flat surface can be obtained through these mechanical processing methods, and the surface roughness mainly depends on the particle diameter of abrasive grains used in processing. That is, the surface roughness becomes large in a case where coarse abrasive grains are used, and the surface roughness becomes small in a case where fine abrasive grains are used. A surface with a small surface roughness is generally called a mirror surface, but in the present invention, is more specifically defined as (1) a surface obtained by performing grinding processing using a high grit number diamond wheel (with fine abrasive grains), (2) a surface obtained through finishing by performing polishing processing, (3) a surface obtained by further performing sacrificial oxidation and oxide film removal, and (4) a surface with surface roughness corresponding to the above-described (1) to (3), except for those cited from Citation List. In the following description of the present specification, a high grit number means a grit number of more than or equal to #4,000, and a low grit number means a grit number of smaller than #4,000.

The seed crystal for single crystal 4H-SiC growth of the present invention has a substantially disk shape having a thickness of more than 1 mm and a diameter of more than 150 mm, and is a seed crystal for single crystal 4H-SiC growth for growing the single crystal 4H-SiC by fixing the seed crystal and a seed crystal support portion through a carbon adhesive. It is desirable to increase the diameter of a single crystal SiC substrate to reduce process cost, and currently, a single crystal SiC substrate having a diameter of 150 mm is commercially available. As a matter of course, it is necessary for the diameter of ingot to be more than or equal to 150 mm in order to cut out a substrate having a diameter of 150 mm from a single crystal ingot, and the diameter of a seed crystal is also preferably more than or equal to 150 mm.

In addition, in a case where the thickness of a seed crystal is too thin, the degree of the change in shape due to the Twyman effect is too large, and therefore, there is a concern that machining allowance for flattening the seed crystal may not be secured and that waviness due to the Twyman effect may not be sufficiently reduced even by applying the technique of the present invention. Accordingly, the thickness of the finished seed crystal is preferably more than 1 mm.

In the present invention, a seed crystal for single crystal 4H-SiC growth having a large surface roughness of the other surface which is an adhesion surface with a single crystal support portion and having small waviness due to the Twyman effect, and a method for processing the same are provided. Measurement of surface roughness (Ra) and waviness can be performed using a stylus-type displacement meter. In this case, it is necessary to determine the evaluation length for scanning a stylus. However, in the case of a seed crystal having a diameter of more than or equal to 150 mm, it is possible to appropriately evaluate waviness by determining the evaluation length as a length obtained by subtracting 10 mm from the diameter (diameter minus 10 mm) even if the diameters of the seed crystal vary to some extent. In addition, Ra can be calculated simultaneously from this measurement.

The waviness value measured in this manner is preferably less than or equal to 12 μm and more preferably less than or equal to 8 μm. This is because adhesion failure between a seed crystal and a seed crystal support portion of a crucible for single crystal growth is easily carried out if the waviness value is more than 12 μm, and a crystal obtained has many macro-defects during crystal growth caused by adhesion failure if a single crystal 4H-SiC is grown in such a state.

The Ra value is preferably more than or equal to 10 nm and more preferably more than or equal to 50 nm. This is because adhesion failure between a seed crystal and a seed crystal support portion of a crucible for single crystal growth is easily carried out if the Ra value is less than 10 nm, and a crystal obtained has many macro-defects during crystal growth caused by adhesion failure if a single crystal 4H-SiC is grown in such a state.

In the present invention, a seed crystal for single crystal 4H-SiC growth is obtained by flattening one surface of a cut, substantially disk-shaped crystal, on which single crystal 4H-SiC growth is carried out, so as to have a mirror surface (with a small surface roughness) which has a small processing-affected layer, and flattening the other surface so as to have a large surface roughness.

The above-described processing techniques for processing a substrate can approximately be applied to the processing of the seed crystal for single crystal 4H-SiC growth as they are. Among these, grinding processing can be preferably applied since a flat surface of which surface roughness is adjusted in a short period of time is obtained. The grinding processing method may provide a reciprocating motion or a rotational motion. Double-side lapping is not quite suitable for the present invention because it is difficult to uniformly distribute a slurry in a case of a thick workpiece.

In a case where a convex warp on the other surface side due to the above-described Twyman effect does not cause a problem, processing of a seed crystal can be performed according the following procedure in order to obtain the above-described seed crystal for single crystal 4H-SiC growth using, for example, a grinding device.

First, a cut, substantially disk-shaped crystal is fixed to a plate with wax or fixed with a vacuum chuck if it can be adsorbed with the vacuum chuck. The other surface is ground with a low grit number diamond wheel (with coarse abrasive grains) so as to become flat, to make the surface roughness of the other surface large.

Next, the other surface which has become flat through the grinding processing is vacuum-adsorbed and fixed with the vacuum chuck. The one surface on which single crystal 4H-SiC growth is carried out is ground first with a low grit number diamond wheel (with coarse abrasive grains) and subsequently with a high grit number diamond wheel (with fine abrasive grains) so as to become flat to obtain a mirror surface (with a small surface roughness) having a small processing-affected layer.

Furthermore, the processing-affected layer may be further made small through finishing by performing polishing processing. Furthermore, sacrificial oxidation and oxide film removal may be performed to remove a slight processing-affected layer remaining in the polishing processing.

In a case where the diameter of a seed crystal was small, the problem did not become apparent. However, it became clear that, in a case where a seed crystal having a diameter of more than or equal to 150 mm was processed according to the above-described procedure, the processed seed crystal underwent a shape change such as a convex warp on the other surface side due to the Twyman effect, and the above-described waviness on the other surface exceeded 12 μm, which caused a problem of adhesion failure. There is no problem if the above-described ratio (aspect ratio) of a thickness to a diameter is substantially about 0.03. However, it was determined that there is a great concern that the shape change may occur due to the Twyman effect when the ratio is smaller than that.

At the beginning of manifestation of the problem, it was not determined that the cause of deterioration of waviness was the Twyman effect, and trial-and-error processing was repeated. However, since the other surface always had a convex warp surface, the present inventors reached a hypothesis that the deterioration of waviness in processing of a large-diameter seed crystal was due to the Twyman effect based on the difference between processing-affected layers on one surface on which single crystal 4H-SiC growth is carried out and the other surface. That is, if there is a difference in volume between processing-affected layers on one surface on which single crystal 4H-SiC growth is carried out and the other surface, a seed crystal is naturally deformed so that an internal stress distribution caused by the difference is reduced. Therefore, in this state, the waviness of the other surface exceeds 12 μm.

The present inventors have examined waviness improvement measures based on this hypothesis, and as a result, they have found a technique in which a seed crystal is fixed in a state of being convexly warped on the other surface side due to the Twyman effect, the other surface which is an adhesion surface with a seed crystal support portion is roughened and flattened, the flattened other surface is vacuum-adsorbed onto a flat table equipped with a vacuum adsorption mechanism to hold the seed crystal so that the flattened other surface becomes a reference surface, and next, one surface on which single crystal 4H-SiC growth is carried out is flattened and formed to a mirror surface to minimize convex warping on the other surface side due to the Twyman effect of the large-diameter seed crystal, which means that the waviness of the other surface is small even in the state where a seed crystal is naturally deformed so that internal stress caused by a difference in volume between processing-affected layers on the one surface on which single crystal 4H-SiC growth is carried out and the other surface of the processed seed crystal is reduced.

Specifically, processing-affected layers due to cutting remain in a cut, substantially disk-shaped seed crystal. Therefore, in order to make the seed crystal enter a state in which the other surface is convexly warped due to the Twyman effect in advance, the cut, subsequently disk-shaped seed crystal may be fixed to a plate with wax or fixed with a vacuum chuck if it can be adsorbed with the vacuum chuck, one surface on which single crystal 4H-SiC growth is carried out may be ground with a low grit number diamond wheel (with coarse abrasive grains) and subsequently with a high grit number diamond wheel (with fine abrasive grains) so as to become flat, to be finished into a mirror surface (with a small surface roughness). The seed crystal of which the other surface is convexly warped in this manner is fixed to the plate with wax, and the other surface is ground with the low grit number diamond wheel (with coarse abrasive grains) so as to become flat, to make the surface roughness of the other surface large. Next, the other surface which has become flat through the grinding processing is vacuum-adsorbed and fixed with the vacuum chuck. The one surface on which single crystal 4H-SiC growth is carried out is ground first with a low grit number diamond wheel (with coarse abrasive grains) and subsequently with a high grit number diamond wheel (with fine abrasive grains) so as to become flat to obtain a mirror surface (with a small surface roughness) having a small processing-affected layer. Furthermore, the processing-affected layer may be further made small through finishing by performing polishing processing. Furthermore, sacrificial oxidation and oxide film removal may be performed to remove a slight processing-affected layer remaining after the polishing processing. The waviness of a large-diameter seed crystal due to the Twyman effect can be minimized by performing processing according to this procedure.

Example

Hereinafter, the effect of the present invention will be made more apparent using an example. The present invention is not limited by the following example and can be implemented with appropriate modifications within the scope not changing the gist of the present invention.

Example

Three substantially disk-shaped crystals (A, B, and C all having a diameter of more than or equal to 150 mm) cut from a substantially columnar single crystal 4H-SiC ingot having a diameter of more than or equal to 150 mm were processed according to the following procedure.

Each of the seed crystals was fixed to a plate with wax, and a carbon surface was ground with a low grit number diamond wheel (with coarse abrasive grains) and subsequently with a high grit number diamond wheel (with fine abrasive grains) so as to become flat to be finished into a mirror surface (with a small surface roughness). The seed crystal of which the silicon surface is convexly warped in this manner was fixed to the plate with wax, and the silicon surface was ground with the low grit number diamond wheel (with coarse abrasive grains) so as to became flat, to make the surface roughness of the silicon surface large.

Next, the silicon surface which had become flat through the grinding processing was vacuum-adsorbed and fixed with a vacuum chuck. The carbon surface was ground first with a low grit number diamond wheel (with coarse abrasive grains) and subsequently with a high grit number diamond wheel (with fine abrasive grains) so as to become flat to obtain a mirror surface (with a small surface roughness) having a small processing-affected layer. Furthermore, the processing-affected layer was further made small through finishing by performing polishing processing.

The thickness of the processed seed crystal was measured with a digimatic indicator, and waviness and surface roughness Ra of the silicon surface were measured with a stylus-type displacement meter. The evaluation length was a length obtained by subtracting 10 mm from the above-described diameter. The thicknesses of A, B, and C were within a range of more than or equal to 1 mm and less than or equal to 0.03 times of the diameter, Ra's of each silicon surface were 80 nm, 70 nm, and 80 nm in order of A, B, and C, and the waviness of each silicon surface was as small as 5.9 μm, 4.9 μm, and 3.8 μm in order of A, B, and C.

Furthermore, sacrificial oxidation and oxide film removal were performed on A, and the waviness of the silicon surface of A was measured (at an evaluation length obtained by subtracting 10 mm from the above-described diameter) in the same manner. As a result, the waviness value thereof was as small as 3.2 μm.

The processed seed crystal was fixed to a seed crystal holding unit, and the crystal 4H-SiC growth was carried out through a sublimation growth method. As a result, it was possible to grow a high-quality single crystal 4H-SiC hardly having macro-defects.

Comparative Example

Two substantially disk-shaped crystals (P and Q all having a diameter of more than or equal to 150 mm) cut from a substantially columnar single crystal 4H-SiC ingot having a diameter of more than or equal to 150 mm were processed according to the following procedure. This procedure will be described using FIG. 2.

Figure 2:
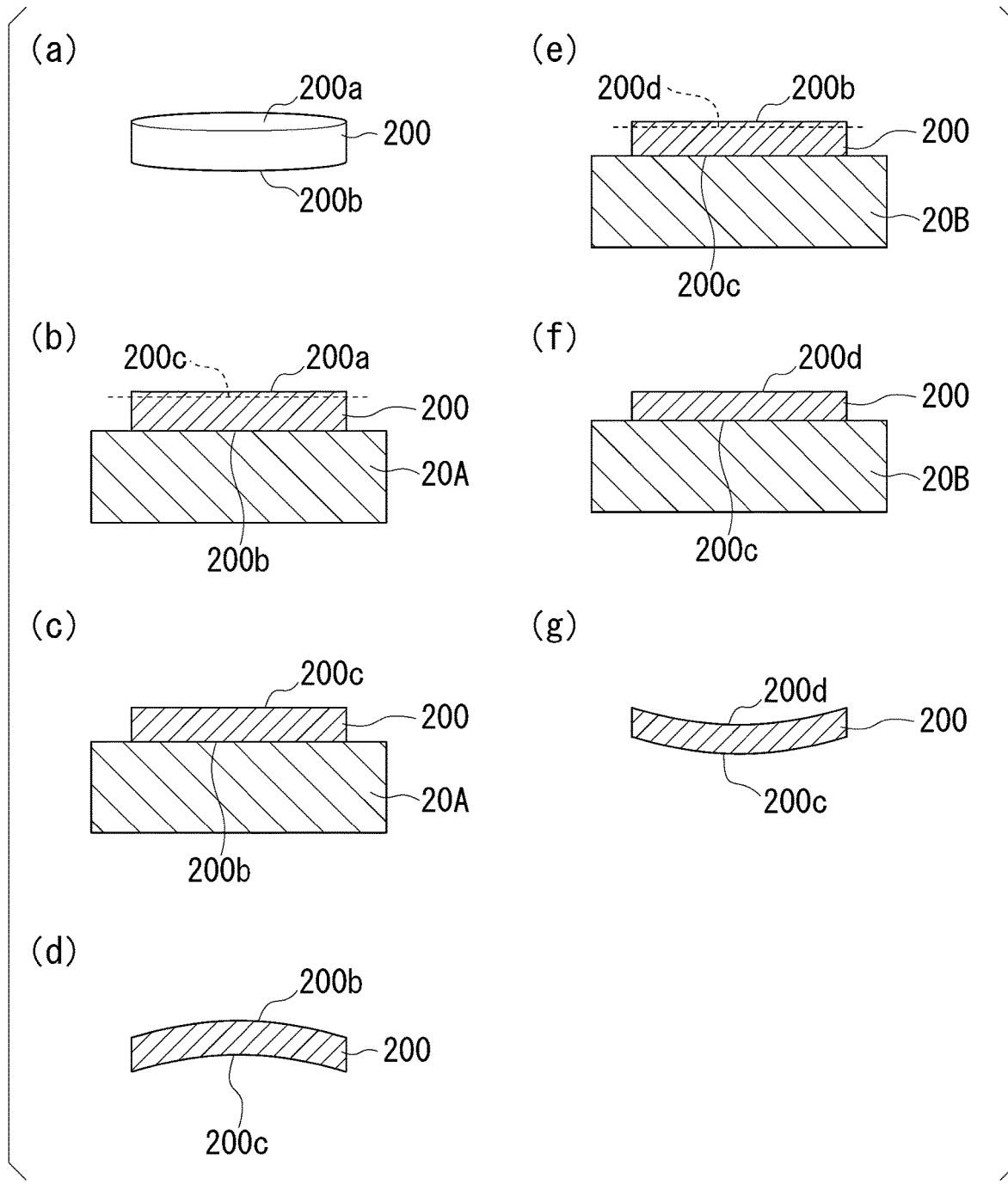
FIG. 2 is a cross-sectional view of an object to be treated in each step included in a method for processing a seed crystal for single crystal 4H-SiC growth in the related art.

Each cut, substantially disk-shaped crystal 200 shown in (a) of FIG. 2 was fixed to a plate 20A with wax as shown in (b) of FIG. 2, a silicon surface 200a was ground with a low grit number diamond wheel (with coarse abrasive grains) so as to become flat to make the surface roughness of the silicon surface large, and a ground silicon surface 200c was obtained as shown in (c) of FIG. 2.

Next, the fixation to the plate 20 was released as shown in (d) of FIG. 2, and then, the silicon surface 200c which had become flat through the grinding processing was vacuum-adsorbed onto a grinding table 20B and fixed with a vacuum chuck as shown in (e) of FIG. 2. Subsequently, a carbon surface 200b was ground first with a low grit number diamond wheel (with coarse abrasive grains) and subsequently with a high grit number diamond wheel (with fine abrasive grains) so as to become flat to obtain a mirror surface 200d (with a small surface roughness) having a small processing-affected layer as shown in (f) of FIG. 2. Furthermore, the processing-affected layer was further made small through finishing by performing polishing processing.

The thickness of the processed seed crystal ((g) of FIG. 2) was measured with a digimatic indicator, and waviness and surface roughness Ra of the silicon surface were measured with a stylus-type displacement meter. The evaluation length was a length obtained by subtracting 10 mm from the above-described diameter. The thicknesses of P and Q were within a range of more than or equal to about 1 mm and less than or equal to 0.03 times of the diameter, Ra's of each silicon surface were 80 nm and 80 nm in order of P and Q, and the waviness of each silicon surface was as large as 15.3 µm and 16.3 µm in order of P and Q.

The processed seed crystal was fixed to a seed crystal holding unit, and the crystal 4H-SiC growth was carried out through a sublimation growth method. As a result, a single crystal 4H-SiC having many macro-defects was obtained.

INDUSTRIAL APPLICABILITY

According to the present invention, in manufacturing of a single crystal SiC through a sublimation method, in a case where a seed crystal and a seed crystal support portion are fixed to each other through a carbon adhesive to allow 4H-SiC growth, it is possible to minimize waviness due to the Twyman effect occurring in a large-diameter seed crystal by roughening the adhesion surface of the seed crystal for improving adhesiveness with the seed crystal support portion and by removing a processing-affected layer, which degrades the quality of grown crystals, on a growth surface. Accordingly, it is possible to solve a problem of a macro-defect during crystal growth caused by adhesion failure between a seed crystal and a seed crystal support portion of a crucible for single crystal growth, which greatly contributes to manufacturing of a large-diameter high-quality single crystal 4H-SiC.

REFERENCE SIGNS LIST 10, 20 Crystal
100a, 100c, 100e, 200a, 200c One surface
100b, 100d, 200b, 200d Other surface
10 Base material
10A, 20A plate
10B, 20B grinding table

What is claimed is:

1. A disk-shaped seed crystal for single crystal 4H-SiC growth having a diameter of more than 150 mm and having a thickness within a range of more than or equal to 1 mm and less than or equal to 0.03 times of the diameter,
wherein one surface on which the single crystal 4H-SiC is grown is a mirror surface and an Ra of the other surface is more than 10 nm, and
wherein an absolute value of magnitude of waviness, in a state where the seed crystal is freely deformed so that an internal stress distribution is reduced, is less than or equal to 12 µm.

2. The seed crystal for single crystal 4H-SiC growth according to claim 1,
wherein the absolute value of the magnitude of the waviness is less than or equal to 8 µm.

3. The seed crystal for single crystal 4H-SiC growth according to claim 1,
wherein the one surface on which the single crystal 4H-SiC is grown is a carbon surface.

4. A method for processing a disk-shaped seed crystal for single crystal 4H-SiC growth having a diameter of more than 150 mm and having a thickness within a range of more than or equal to 1 mm and less than or equal to 0.03 times of the diameter, the method comprising:
a first step of cutting out a disk-shaped crystal from a columnar single crystal 4H-SiC ingot having a diameter of more than 150 mm;
a second step of fixing the crystal to a base material to grind one surface on which the single crystal 4H-SiC is grown so as to have a flat mirror surface;
a third step of releasing the fixation of the crystal to the base material so that the one surface and the other surface of the crystal respectively become a concave surface and a convex surface due to the Twyman effect;
a fourth step of fixing the one surface side of the crystal to a plate so that the concave state of the one surface is maintained;
a fifth step of grinding the other surface which has become convex so as to have a flat surface having an Ra of more than 10 nm;
a sixth step of releasing the fixation of the crystal to the plate;
a seventh step of vacuum-adsorbing the other surface side of the crystal onto a flat grinding table equipped with a vacuum adsorption mechanism; and
an eighth step of grinding the one surface which has become concave so as to have a flat mirror surface,
wherein grinding amounts in the first step, the fifth step, and the eighth step are adjusted so that an absolute value of magnitude of waviness of the crystal in a state where the seed crystal is freely deformed so that an internal stress distribution is reduced becomes less than or equal to 12 µm.

5. The method for processing a seed crystal for single crystal 4H-SiC growth according to claim 4, further comprising:
subsequently polishing and finishing the one surface after the eighth step.

6. The method for processing a seed crystal for single crystal 4H-SiC growth according to claim 4,
wherein the one surface on which the single crystal 4H-SiC is grown is a carbon surface.

7. The method for processing a seed crystal for single crystal 4H-SiC growth according to claim 4,
wherein the grinding amounts in the first step, the fifth step, and the eighth step are adjusted so that an absolute value of magnitude of waviness of the crystal becomes less than or equal to 8 μm.

* * * * *